(12) United States Patent
Su et al.

(10) Patent No.: US 8,945,414 B1
(45) Date of Patent: Feb. 3, 2015

(54) OXIDE REMOVAL BY REMOTE PLASMA TREATMENT WITH FLUORINE AND OXYGEN RADICALS

(71) Applicant: Intermolecular Inc., San Jose, CA (US)

(72) Inventors: Jingang Su, Cupertino, CA (US); Ashish Bodke, San Jose, CA (US); Abhijit Pethe, San Jose, CA (US); J Watanabe, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/079,442

(22) Filed: Nov. 13, 2013

(51) Int. Cl.
  *B44C 1/22* (2006.01)
  *C03C 15/00* (2006.01)
  *C03C 25/68* (2006.01)
  *C23F 1/00* (2006.01)
  *H01L 21/3065* (2006.01)
  *H01L 21/02* (2006.01)

(52) U.S. Cl.
  CPC ...... *H01L 21/3065* (2013.01); *H01L 21/02238* (2013.01)
  USPC ............................................. 216/79; 438/723

(58) Field of Classification Search
  USPC .................................... 216/79; 438/706, 723
  See application file for complete search history.

(56) References Cited

U.S. PATENT DOCUMENTS

| 5,188,704 A | 2/1993 | Babie |
| 6,362,085 B1 | 3/2002 | Yu |
| 6,946,368 B1 | 9/2005 | Vandroux |
| 7,053,002 B2 | 5/2006 | Cohen |
| 7,501,349 B2 | 3/2009 | Dip |
| 7,780,793 B2 | 8/2010 | Yang |
| 7,902,018 B2 | 3/2011 | Kraus |
| 8,372,756 B2 * | 2/2013 | Mitchell et al. ............... 438/723 |
| 8,536,060 B2 * | 9/2013 | Chen et al. .................... 438/706 |
| 2007/0107750 A1 | 5/2007 | Sawin |
| 2013/0052827 A1 | 2/2013 | Wang |

FOREIGN PATENT DOCUMENTS

| JP | 2001077193 A | 3/2001 |
| WO | WO-01-08209 A1 | 2/2001 |

OTHER PUBLICATIONS

Muller et al.; The electronic structure at the atomic scale of ultrathin gate oxides; Jun. 24, 1999; Macmillan Magazines Ltd.
Ueno et al.; H2 surface treatment for gateoxidation of SiC metaloxidesemiconductor field effect transisitsors; Jan. 1, 1999; Elsevier Science S.A.
Morita; Native Oxide Films and Chemical Oxide Films; Jan. 1, 1998; Springer-Verlag Berlin Heidelberg; Unknown.

* cited by examiner

*Primary Examiner* — Roberts Culbert

(57) ABSTRACT

Oxides (e.g., native or thermal silicon oxide) are etched from underlying silicon with a mixture of fluorine and oxygen radicals generated by a remote plasma. The oxygen radicals rapidly oxidize any uncovered bare silicon areas, preventing the pitting that can result from fluorine etching bare silicon more rapidly than it etches the surrounding oxide. A very thin (few Å), highly uniform passivation layer remaining on the silicon after the process may be left in place or removed. An oxygen-impermeable layer may be formed in-situ immediately afterward to prevent further oxidation. A pre-treatment with oxygen radicals alone fills pores and gaps in the oxide before etching begins.

20 Claims, 5 Drawing Sheets

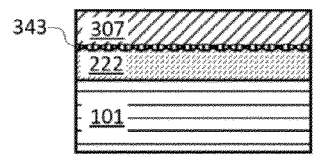
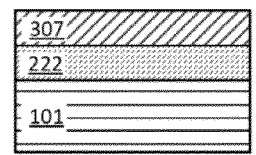
FIG. 3A        FIG. 3B
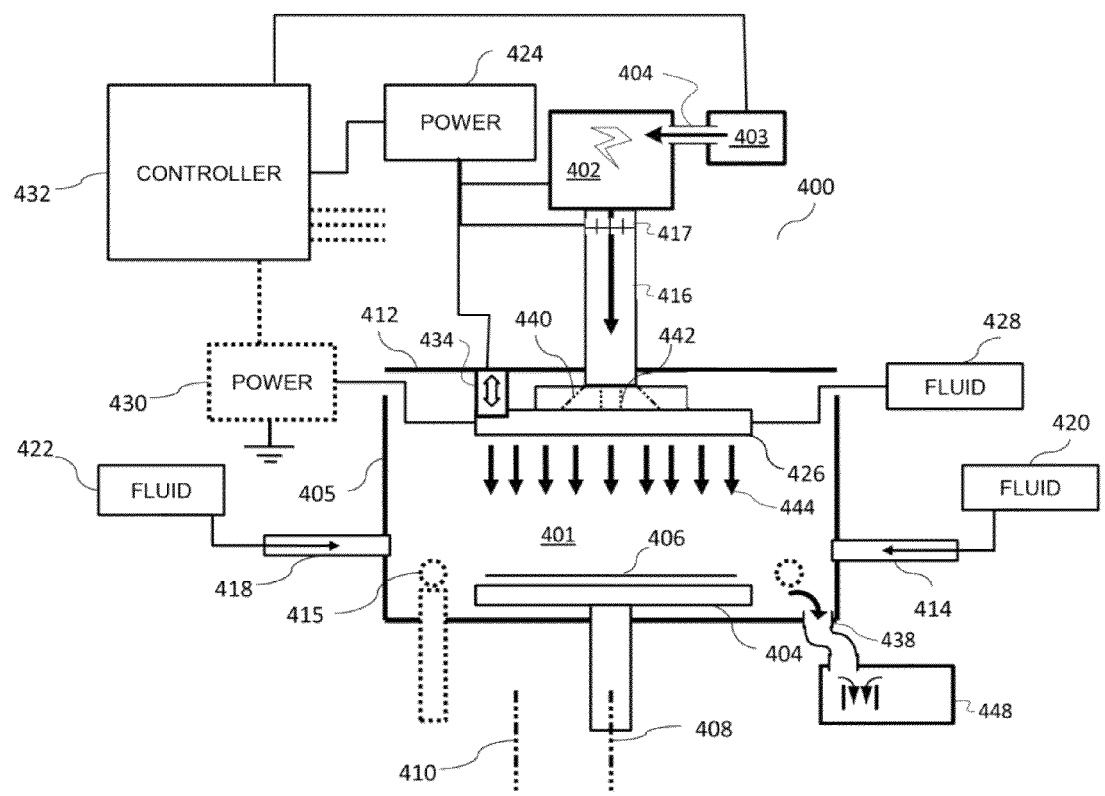
FIG. 4

OXIDE REMOVAL BY REMOTE PLASMA TREATMENT WITH FLUORINE AND OXYGEN RADICALS

BACKGROUND

Related fields include semiconductor processing, particularly the controlled etching or removal of silicon oxides.

In the fabrication of semiconductor devices, the removal of a silicon oxide (generically, "$SiO_x$") layer from a substrate is often necessary. The silicon oxide being removed may be the ~15 Å "native" oxide that grows when bare silicon (Si) is exposed to oxygen. Alternatively, it may be a thermal oxide (e.g., formed by rapid thermal oxidation (RTO)) or a deposited silicon-containing oxide that needs to be patterned (e.g., a hard mask). Other examples may be found throughout the industry.

Plasma treatment with nitrogen trifluoride ($NF_3$) has been widely used to remove Si and $SiO_x$ layers. F* radicals from the plasma react with Si to form gaseous $SiF_4$. Some common process gas mixtures are $NF_3$ with ammonia ($NH_3$) and $NF_3$ with hydrogen ($H_2$). $NF_3$ is highly selective to silicon over silicon oxide; that is, it etches Si much faster than it etches $SiO_x$. As a result, when it is used to remove a $SiO_x$ layer from directly underlying Si, the etch rate increases sharply when the reactive F* radical species from the $NF_3$ encounter the Si.

If the etch is uniform and the reaction is not halted soon enough, the underlying Si may be thinned more that the device design will tolerate. If the etch is non-uniform (for example, if the $SiO_x$ is porous, as is common in native oxides, or if the $SiO_x$ layer has non-uniform thickness, composition, or density), the F* radicals rapidly etch pits under the pores or easiest-etched locations while the rest of the $SiO_x$ is still being etched/removed. The resulting surface has pits, patches of unetched $SiO_x$ residue, or both, resulting in a surface roughness of 7-11 nm or greater.

As electrical, optical, and other silicon devices shrink in scale, they generally become less tolerant of surface roughness and variations in thickness. Therefore, a need exists for a method of removing native and other forms of $SiO_x$ from Si with good control of the process endpoint and with a smooth surface on the etched area.

SUMMARY

The following summary presents some concepts in a simplified form as an introduction to the detailed description that follows. It does not necessarily identify key or critical elements and is not intended to reflect a scope of invention.

Remote plasma treatments using oxygen radicals and fluorine radicals controllably remove $SiO_x$ from Si and leave a smooth surface by balancing $SiO_x$ etching with selective partial regrowth. The regrowth fills pores and low spots with new $SiO_x$ to keep F* radicals from reaching and attacking the Si in localized areas that would otherwise become exposed before other areas were completely etched.

In some embodiments, F* radicals and O* radicals are generated by a remote plasma source and conveyed to a process chamber, where a substrate with an oxide layer is positioned. One or more selected areas of the oxide layer are exposed to the reactive species until the desired thickness of oxide is removed from the exposed area(s). The relative concentrations of F* radicals and O* radicals, their flow rates, and other parameters are selected for each process step based on the nature of the oxide layer and the desired result.

For example, a porous native oxide may be detected on a Si surface. Initially, the substrate is exposed to O* radicals that percolate through the oxide pores. When the O* radicals reach the underlying Si, they react to fill the bottom of the pore with non-porous $SiO_x$. When the oxide layer is no longer porous, F* radicals are introduced in the chamber along with the O* radicals. As the F*radicals etch the oxide, the O* radicals may react with any Si that becomes exposed, but not with the existing oxide. Thus the etch rate of the oxide is comparable to that of other $NF_3$ plasma treatments, but no pits are formed.

When only a very thin (1-5 Å), highly uniform layer of oxide remains, the O* radicals may be purged from the chamber to allow the F* radicals to fully expose the underlying Si, or the very thin oxide layer may be left in place as a passivation layer. In some embodiments, the next layer of the device is then formed in-situ in the same process chamber without exposing the substrate to any further oxidation.

Film stacks made using this process have interfaces between Si layers and adjacent subsequently-deposited non-$SiO_x$ layers with a surface roughness less than 3 Å rms; for instance, between 0.5 and 3 Å rms. The interfaces may be free of $SiO_x$ or may have a non-porous $SiO_x$ passivation layer less than about 5 Å thick.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIGS. 3A and 3B conceptually illustrate forming an overlying layer in-situ after removing most or all of the SiOx from Si.

FIG. 4 is a schematic of an example of a process chamber configured for remote-plasma treatment of substrates.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes. Substrates may be processed by the described methods in any suitable type of workflow such as single substrate processing, multiple substrate batch processing, in-line continuous processing, in-line "stop and soak" processing, or roll-to-roll processing.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. (5) "Substantially" contemplates up to 5% variation.

As used herein, "etch" shall mean any chemical removal of solid material, whether or not the material is being removed in any specific pattern. "Film" and "layer" are used as synonyms to represent a portion of a stack, and may mean either a single layer or a portion of a stack with multiple sub-layers (e.g., a nanolaminate). Substrates may be processed by the described methods in any suitable type of workflow such as single substrate processing, multiple substrate batch processing, in-line continuous processing, in-line "stop and soak" processing, or roll-to-roll processing.

Figure 1A:
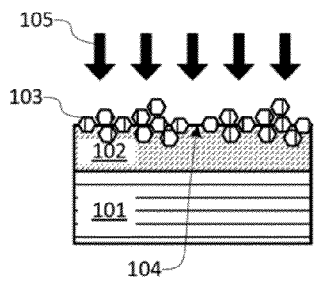
FIGS. 1A-1C conceptually illustrate etching SiOx from Si with Si-selective plasma-activated species.
Figure 1B:
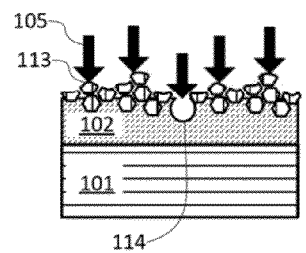
Figure 1C:
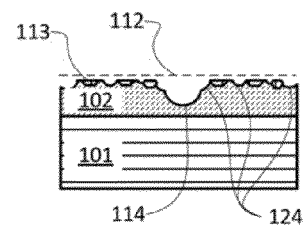

FIGS. 1A-1C conceptually illustrate etching $SiO_x$ from Si with Si-selective plasma-activated species. In FIG. 1A, Si layer 102 on substrate 101 (which may include underlying layers and other structures) has overlying $SiO_x$ layer 103. The illustration shows oxide formation both above and below the original Si surface, which is characteristic of native and thermal silicon oxides. However, $SiO_x$ layer 103 may be a native oxide, a thermal oxide, or an oxide of silicon formed by any other means. The bare Si surface of Si layer 102 is exposed by pore 104 in $SiO_x$ layer 103. Pores are often found in native and thermal silicon oxides, but other oxide layers such as deposited oxides may also have pinholes, cracks, thin spots, areas of poor adhesion, or other types of gaps or pores that expose the underlying Si in localized areas. Si-selective species 105 is a plasma-activated species, such as F* radicals, that etches Si more rapidly than it etches $SiO_x$.

In FIG. 1B, after some exposure time, Si-selective species 105 has etched some of $SiO_x$ layer 103, leaving residual $SiO_x$ 113. The $SiO_x$ is etched at a uniform rate so that residual $SiO_x$ 113 has the same surface profile as the initial $SiO_x$ layer 103, which in the illustrated case is uneven. Meanwhile, Si-selective species 105, coming into contact with the bare Si in pore 104, etch Si layer 102 more rapidly than $SiO_x$ layer 103 was etched, thus carving out a pit 114 in the underlying Si.

In FIG. 1C, after additional exposure time, the surface of Si layer 102 is etched below its original level 112. Most of $SiO_x$ layer 103 is removed, but some residual $SiO_x$ 113 that initially formed below original level 112 may remain. Pit 114 is enlarged by the additional etching, and additional pits 124 have formed whenever Si-selective species 105 etched through the thinner parts of $SiO_x$ layer 103 to contact bare Si. The size of the pits varies by the amount of time the bare Si was exposed to the Si-selective species. Thus additional pits 124 are smaller than pit 114 because Si-selective species 105 first needed to etch through some $SiO_x$ to reach the bare Si, and the time it took to do this reduced the exposure time to the Si underneath.

Figure 2A:
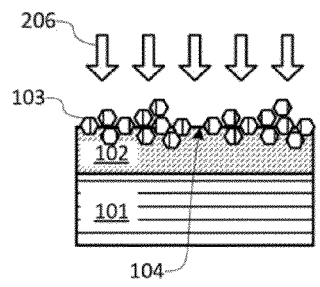
FIGS. 2A-2F conceptually illustrate etching SiOx from Si using Si-selective plasma-activated species to remove the SiOx and oxygen radicals to passivate exposed Si.

FIGS. 2A-2F conceptually illustrate etching $SiO_x$ from Si using Si-selective plasma-activated species to remove the $SiO_x$ and oxygen radicals to passivate exposed Si. In FIG. 2A, the substrate 101 with Si layer 102 is known or suspected to have a pore 104 in $SiO_x$ layer 103 when it is provided and placed in the process chamber. To protect pore 104 from the Si-selective species used for etching, the substrate is initially exposed to O* radicals 206.

Figure 2B:
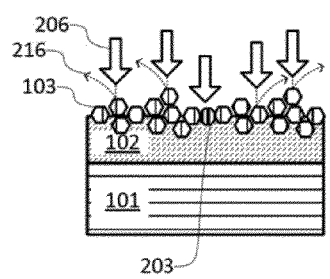

In FIG. 2B, the O* radicals 206 have reacted to form new oxide 203 on the bare Si exposed in pore 104, effectively filling pore 104 by rapid plasma oxidation (RPO). RPO often yields more uniform oxide layers than RTO. O* radicals 206 only react with exposed Si; those encountering the existing $SiO_x$ layer 103 do not react, as symbolized by the "bounce lines" 216. Therefore, this pre-etch treatment does not increase the overall thickness of $SiO_x$ layer 103; it only fills pores, pinholes, cracks, or other gaps where bare Si is exposed.

If it is known that no bare Si is initially exposed on the substrate, the steps illustrated in FIGS. 2A and 2B may be omitted.

Figure 2C:
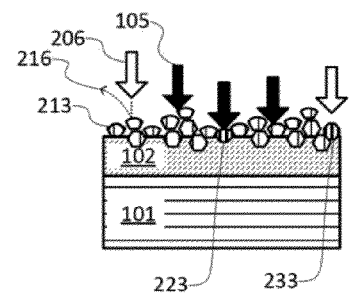
Figure 2D:
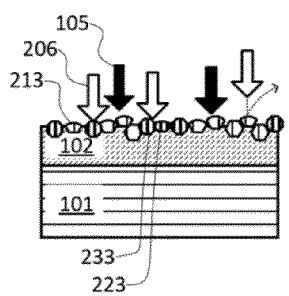

In FIG. 2C, Si-selective species 105 (e.g., F* radicals) have been introduced into the process chamber along with the O* radicals and some time has passed. Si-selective species 105 etched $SiO_x$ layer 103, leaving residual $SiO_x$ 113. However, Si-selective species 105 could not form a pit in the underlying Si because pore 104 was partially filled by new RPO oxide 203. Instead, Si-selective species 105 etched the RPO oxide 203, leaving residual RPO oxide 223.

Without being bound to any particular theory, the empirical results suggest that whenever Si-selective species 105 uncover bare Si by etching through the thinner parts of $SiO_x$ layer 103, the O* radicals 206 immediately form additional new RPO oxide 233 before Si-selective species 105 can form a pit. RPO generally has a high reaction rate constant (higher than, for example, RTO), so that a sufficient concentration of O* radicals 206 can prevent pit formation by Si-selective species 105. Meanwhile, O* radicals 206 do not react with residual $SiO_x$ 113 or residual RPO oxide 223, so the oxide layer as a whole is not re-growing; only any gaps that expose bare Si are being filled as they form.

IN FIG. 3D, more time has passed. The relative concentration of Si-selective species 105 and O* radicals 206 may or may not be varied, depending on the embodiment. The oxide layer over Si layer 102 has become thinner, but also more uniform as a result of thin new RPO oxide 233 growing only on exposed Si and all the oxide continuing to be etched by Si-selective species 105.

Figure 2E:
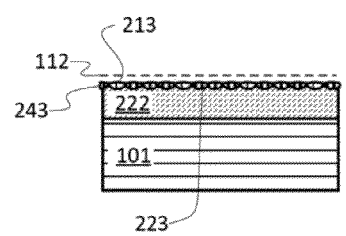

In FIG. 2E, Si layer 102 has been etched below its original level 112 down to thinner Si layer 222 with a very thin (few Å) oxide passivation layer 243. Passivation layer 243 is thinner, more uniform, and less porous than a native oxide. Passivation layer 243 may be 100% residual RPO oxide 223, or it may also incorporate some residual original oxide 213. In some embodiments, passivation layer 243 may be left in place for the next process.

Figure 2F:
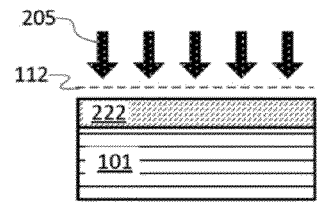

In FIG. 2F, the substrate is optionally further exposed to a generic $SiO_x$ etch process 205 to remove the passivation layer. For example, it may be preferable to do so if the next layer to be deposited is not oxygen-tolerant. $SiO_x$ etch process 205 may involve Si-selective species 105, or it may not. In any case, because the passivation layer is thin and uniform, etch process 205 reaches the bare Si at practically the same time for every region of the exposed part of the substrate. Any non-uniformities (for example, if residual original oxide 213 makes up part of the passivation layer and is etched slightly faster than residual RPO oxide 223) are mitigated by the short exposure time needed to remove such a thin oxide layer. Thus, pits have virtually no opportunity to form during the removal of the passivation layer.

Whether or not the passivation layer is removed, the resulting bare-Si or passivation surfaces may be very smooth, <3 Å rms, because pitting was prevented by the use of the O* radicals to protect exposed Si while all, or almost all, of the $SiO_x$ was being removed. This surface smoothness can produce consistent results in small-scale devices fabricated with the Si layer, and promote uniformity in the next layer formed on the surface.

FIGS. 3A and 3B conceptually illustrate forming an overlying layer in-situ after removing most or all of the $SiO_x$ from Si. If the etched bare or passivated Si layer is covered by one or more additional layers, preferably oxygen-impermeable layers (e.g., a metal layer), before being exposed to ambient air or to other sources of oxygen, no more native oxide will be able to grow on the Si. As used herein, "impermeable" shall mean having a diffusivity as a solvent, where oxygen is the solute, of less than 1e-9. Depositing the overlayer in-situ (in the same chamber, or in another chamber of a sealed multi-chamber system, without breaking vacuum or introducing more oxygen before the overlayer becomes oxygen-impermeable), can produce this result. FIG. 3A shows overlayer 307 deposited over passivation layer 343, which in this example is shown as all-RPO oxide. FIG. 3B shows overlayer 307 deposited over etched Si layer 222 after removing the passivation layer. In either case, overlayer 307 may be oxygen-impermeable and/or may be a stack of multiple sublayers.

FIG. 4 is a schematic of an example of a process chamber configured for remote-plasma treatment of substrates. Process chamber 400 is defined by a housing that includes a sidewall 405 and a lid 412 enclosing a chamber interior 401. Processing chamber 400 also includes a substrate support 404 configured to hold a substrate 406. Substrate support 404 may include a vacuum chuck, electrostatic chuck or other substrate-securing mechanism. Substrate support 404 may be configured to rotate around its own central axis 408 revolve around a second axis 410, translate horizontally or vertically, or any combination). Motion may be achieved through suitable drive mechanisms such as magnetic drives, linear drives, worm screws, lead screws, differentially pumped rotary feedthrough drives, etc. Substrate support 404 may be temperature-controllable.

Substrate 406 may be a round 200 mm or 300 mm wafer, or any other suitable size or shape. Substrate 406 may be a blanket substrate, a coupon (e.g., partial wafer), or even a patterned substrate having predefined regions. Substrate 406 may be masked so that the etching, deposition, or other process only occurs in designated parts of the surface. The mask may be attached to substrate 406, or it may be a separate article held by substrate support 404 or some other feature of chamber 400.

Plasma generation source 402 is operable to provide plasma-activated species that may include charged species (e.g., ions and free electrons) and non-charged species (e.g., radicals). Precursors from one or more precursor source 403 are controllably fed into plasma generation source 402 through one or more precursor conduits 404. Inside plasma generation source 402, the precursors are excited by a plasma-generating field, such as direct-current (DC), radio-frequency (RF) or microwave, to produce the plasma-activated species. Precursors for F* radicals include $NF_3$, $BF_3$, $SiF_4$, and $CF_4$. Precursors for O* radicals include $O_2$, $O_3$, and $H_2O$. In some embodiments, multiple types of plasma may be generated simultaneously.

Once generated, the plasma-activated species exit plasma generation source 402 through plasma conduit 416. Optionally, plasma conduit 416 may include an ion filter 417. Ion filter 417 may use a magnetic or electrostatic field, or other means, to filter charged particles out of the plasma-activated species. This can be useful when it is desirable to expose the substrate only to radicals; for example, when charged particles could damage or otherwise undesirably affect the substrate surface. In some embodiments, the plasma activated species traveling through plasma conduit 416 may have a non-reactive outer portion 440 surrounding a reactive inner portion 442.

From the section of plasma conduit 416 that penetrates chamber lid 412, the plasma-activated species 440, 442 pass through showerhead 426, which in this example is suspended in chamber interior 401 above substrate 406. Showerhead 426 diffuses the plasma-activated species flow through a multiple injection ports into multiple paths 444. Showerhead 426 may be grounded, or power supply 430 may impose or modulate a charge on the showerhead 426. Showerhead 426 may optionally be movable by means of showerhead translator 434. In some embodiments, showerhead translator 434 may translate showerhead 426 dynamically as processing continues.

A power source 424 provides power to plasma generation source 402 and, if needed, to ion filter 417, showerhead translator 434, and (connection not shown) substrate support 404. It should be appreciated that power source 424 may output a direct current (DC) power supply, a pulsed DC power supply, or a radio frequency (RF) power supply.

Fluid inlets 414 and 418 extend into chamber interior 401 through sidewalls 405 of the chamber 400. In some embodiments, fluid inlets may extend through the lid or floor of the process chamber. Fluid inlet 414 is in fluid communication with fluid source 420, while fluid inlet 418 is in fluid communication with fluid source 422. Alternatively, fluid inlets 414 and 418 may be in fluid communication with the same fluid source. In some embodiments, fluid inlets 414 and 418 may encompass a perimeter of substrate 406, optionally being configured as ring portions surrounding substrate 406. In some embodiments, fluid inlets 414 and 418 may be movable to track the movement of the substrate and substrate support. An additional fluid source 428 may be coupled to (i.e., in fluid communication with) showerhead 426; for example, to provide a buffer or other gas to the showerhead during processing.

To remove ambient atmosphere, excess precursors, buffer gases, waste products, and other fluids from chamber interior 401, one or more vacuum pumps 448 may be in fluid communication with chamber interior 401 via one or more exhaust ports 438. Exhaust port 438 may be located on any convenient or effective area of chamber 400.

Process chamber 400 also includes a controller 432 in operable communication with the other components of the chamber 400, such as precursor source 403; fluid sources 420, 422, and 428; power supplies 424; substrate support 404, etc. For drawing simplicity, not all connections are shown. Controller 432 may include a processor, memory such as random access memory (RAM), and a data-storage device such as a hard drive. Controller 432 controls the operation of the various parts of chamber 400 to perform the methods described herein.

A process chamber like that in FIG. 4 may be used for various types of plasma treatments, including deposition as well as etching and others. A feedstock of a film to be deposited may be controlled independently of the plasma. For example, while the plasma activated species pass through showerhead 426 into chamber interior 401, the film feedstock may be delivered through distribution ring 415 above or near the substrate surface. Deposition of a material layer results from the feedstock interacting with the plasma near the substrate surface.

A process chamber 400 may be used to etch $SiO_x$ from underlying Si using fluorine and oxygen radicals. Fluorine precursors (e.g., nitrogen trifluoride) and/or oxygen precursors (e.g., water, ozone, oxygen gas) may be fed from precursor source 403, converted to active species in plasma generation source 402, and routed to substrate 406 through plasma conduit 416 and showerhead 426. If desired, ion filter 417 may be used to remove charged particles from plasma conduit 416 so that only radicals reach substrate 406. Between process steps, the chamber may be purged by using vacuum pump 448 to draw vacuum through exhaust port 438, and optionally introducing a purge gas through any of fluid inlets 414, 415, or 418. Optionally, when the etch process is complete, a film feedstock may be introduced through any of fluid inlets 414, 415, or 418, and different precursors may be converted to active species in plasma generation source 402 if appropriate, to form an overlying layer on the etched Si (with or without the passivation layer) in situ without breaking vacuum or removing substrate 406 from process chamber 400.

Figure 5:
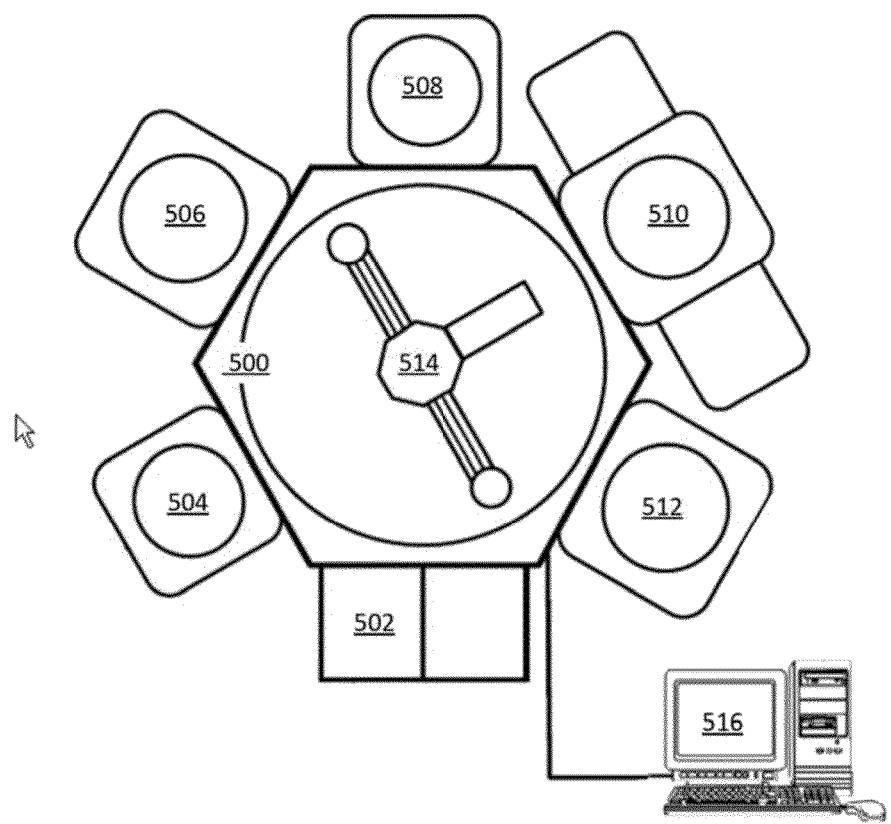
FIG. 5 is a schematic of a multi-functional process chamber.

FIG. 5 is a schematic of a multi-functional process chamber. If the process chamber is equipped to perform other types of processing as well as plasma treatments, more different types of films may be deposited in-situ in the same chamber immediately after finishing the etch process. The illustrated system is similar to high-productivity combinatorial (HPC) process tools described, inter alia, in U.S. Pat. No. 7,867,904. A frame 500, which may be constructed as a unitary frame and may have a controlled internal environment, supports a plurality of processing modules 504-512. Load lock interface 502 provides access into the plurality of modules of the system. Robot 514 moves substrates and masks between the modules and into and out of the load lock 502.

Modules 504-512 may be any set of conventional or combinatorial modules. For example, module 504 may be an orientation/degassing module, module 506 may be a clean module, module 508 may be a plasma treatment module, and module 510 or 512 may be configured to form film layers by some other method such as chemical vapor deposition (CVD), physical vapor deposition (PVD), atomic layer deposition (ALD), electrochemical deposition (ECD), evaporative coating, dip-coating, spin-coating, or the like. In some embodiments, a centralized controller, i.e., computing device 516, may control the processes of the multi-function system, including the power supplies and synchronization of the process duty cycles. In such a multi-function system, the etching of $SiO_x$ from underlying Si can be done in one of the modules, and then the substrate can be moved to a coating module that forms an overlying layer. Due to the controlled environment inside frame 500, the formation of the overlying layer is still "in-situ" because the different modules are all effectively parts of the same chamber.

Figure 6:
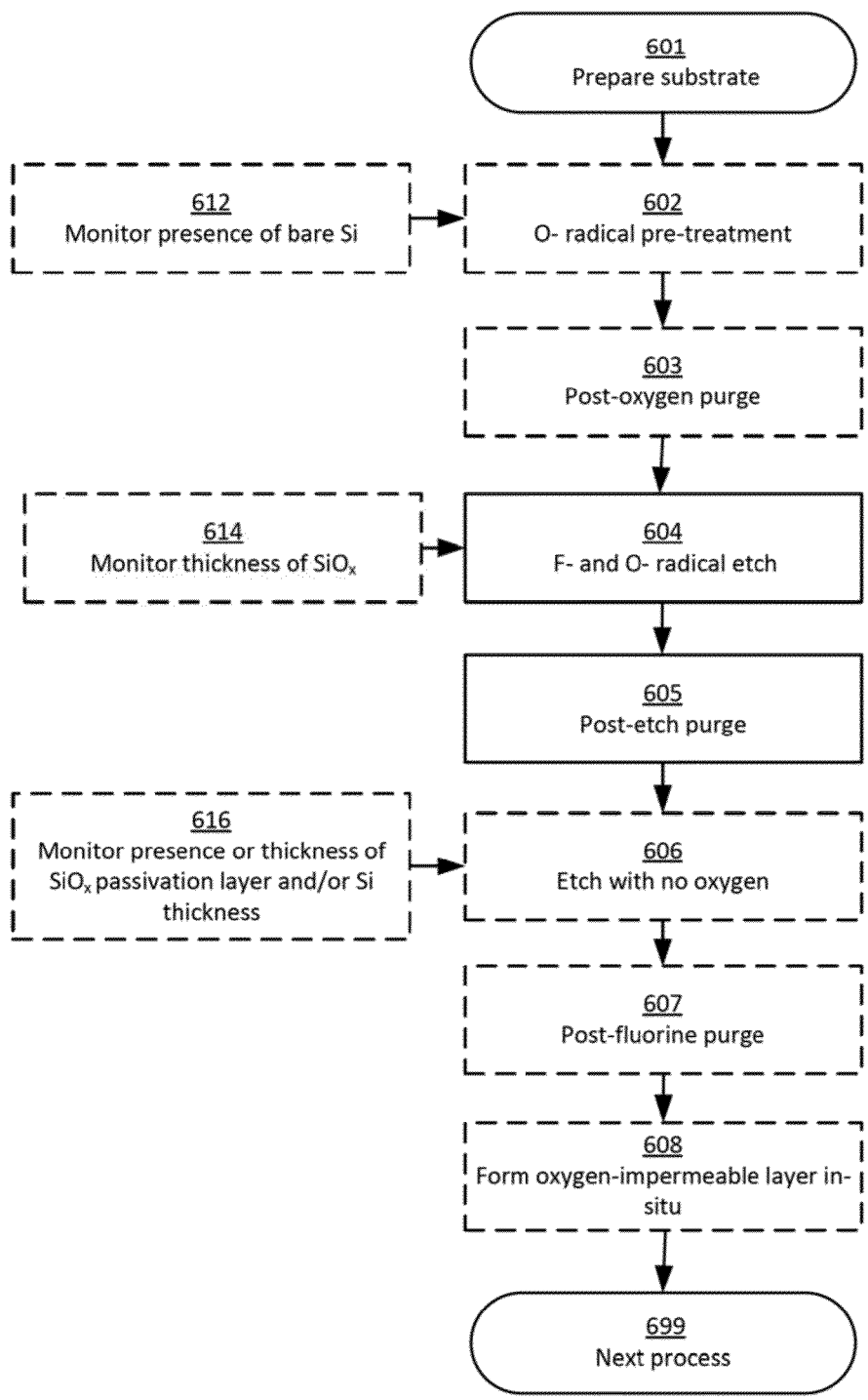
FIG. 6 is a flowchart of an example process for etching SiOx from Si using Si-selective plasma-activated species to remove the SiOx and oxygen radicals to passivate exposed Si.

FIG. 6 is a flowchart of an example process for etching $SiO_x$ from Si using Si-selective plasma-activated species to remove the $SiO_x$ and oxygen radicals to passivate exposed Si. The substrate is initially prepared 601 (e.g., cleaned, degassed) and positioned in the process chamber. The temperature of the substrate may be maintained within a range of about 25-400 C. Chamber pressure may be 0.5-1 Torr.

If desired (e.g., if the $SiO_x$ to be etched is known or suspected to have pores, pinholes, or other gaps in which bare Si is exposed), the substrate may be pre-treated 602 using O* radicals without any etching species. This pre-treatment covers any exposed Si with RPO $SiO_x$ to prevent the etching species from attacking the Si to form pits. The presence of bare Si may be monitored 612 during pre-treatment (e.g., by reflectometry or spectroscopy) and the pre-treatment can be ended when the monitoring results show no more bare Si. Alternatively, the process may continue for a fixed duration that is known, given the flow rate of the oxygen, to cover the exposed Si with RPO $SiO_x$. Optionally, a post-oxygen purge 603 may clear the O* radicals from the chamber after the pre-treatment to adjust the relative concentration of O* radicals and Si-etching species (e.g., F* radicals) to a desired ratio.

Next, the $SiO_x$ layer is exposed to a mixture of O* and F* radicals for etching 604. The radicals may be generated in a remote plasma with an RF power of 100-1000 W. The flow rate of F* precursor (e.g., $NF_3$) may be between about 5 and 100 sccm. The flow rate of O* precursor (e.g., $O_2$) may be between about 15 and 500 sccm. The ratio of $NF_3$ to $O_2$ may be about between about 0.1 and about 10. The etch rate may be about 3-7 Å/min. The O* radicals oxidize any new bare Si uncovered by the F* radicals, but they do not react with the existing oxide. While etching 604, the $SiO_x$ layer thickness may optionally be monitored 614 and the process stopped when a desired thickness, such as the few Å for a passivation layer, is reached. Alternatively, the process may continue for a fixed duration known to produce the desired thickness; for example, between about 30 seconds and about 15 minutes. After the etching, the chamber may be subjected to a post-etch purge 607 to remove the F* and O* radicals from the chamber. Surface roughness of the etched surface, as measured, e.g., by atomic force microscope (AFM) may be about 0.5-3 Å rms.

Optionally, the passivation layer may be removed by a non-oxygen etch 606. Non-oxygen etch 606 may use F* radicals or some other plasma or non-plasma etchant. During non-oxygen etch 606, the presence or thickness of the passivation layer, and/or the thickness of the underlying Si, may be monitored 616, and the process stopped when the monitoring results confirm that the passivation layer is removed to a desired extent. Alternatively, the process may continue for a fixed duration known to produce the desired extent of removal.

Optionally, an oxygen-impermeable layer, such as a metal layer or a metal nitride layer, may be deposited or otherwise formed in-situ before breaking vacuum or otherwise exposing the passivated or bare Si to additional oxygen as part of a next process 699. This may be done in the same chamber in an apparatus like that shown in FIG. 4, or in another module of a sealed multi-module system like that shown in FIG. 5.

Figure 7A:
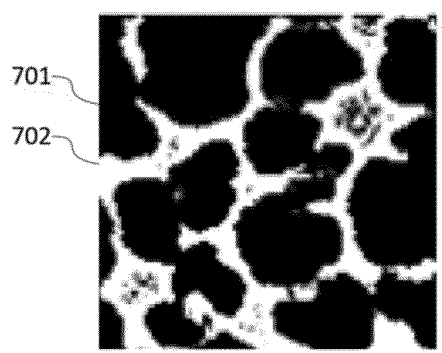
FIGS. 7A and 7B are monochrome representations of SEM images of Si surfaces with SiOx overlayers removed by F* radicals alone and by combined F* and O* radicals.
Figure 7B:
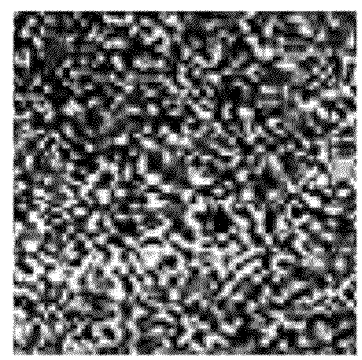

FIGS. 7A and 7B are monochrome representations of SEM images of Si surfaces with $SiO_x$ overlayers removed by F* radicals alone and by combined F* and O* radicals. Sections of 300,000×SEM images were adjusted to near 100% contrast, then the gamma and sharpness were manipulated so that the features of the original grayscale images could be seen in the black-and-white images.

In FIG. 7A, 1000 Å of native $SiO_x$ was removed from Si by exposing the substrate for 10 minutes to F* radicals from an $NF_3$ precursor activated by a 500 W RF plasma. At a flow rate of about 15 sccm for the $NF_3$, the etch rate was about 4 Å/min. Bare Si 701 (dark regions) is visible, but patchy and interspersed with residues of un-etched native oxide 702 (lighter regions). Surface roughness measured by AFM was about 9 nm rms.

In FIG. 7B, the process conditions were similar except that $O_2$ precursor was delivered to the plasma generation source at a flow rate of 25 sccm for a comparable etch rate of about 4 Å/min. This surface is much more uniform, without the light and dark patches visible in FIG. 7A. Surface roughness measured by an AFM was about 0.6 nm rms. Therefore, the passivation action of the O* radicals results in a much smoother, more uniform etched surface.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method of etching a pre-existing oxide, the method comprising:
   positioning a substrate in a process chamber, wherein the substrate comprises a semiconductor material under the pre-existing oxide;
   generating oxygen radicals and fluorine radicals in a plasma generation source; and
   exposing the substrate to the oxygen radicals and the fluorine radicals;
   wherein the oxygen radicals oxidize uncovered parts of the underlying semiconductor material to form new oxide; and
   wherein the fluorine radicals etch the pre-existing oxide and the new oxide.

2. The method of claim 1, wherein the semiconductor material is silicon.

3. The method of claim 1, wherein the pre-existing oxide is a silicon oxide.

4. The method of claim 2, wherein the pre-existing oxide is a native oxide or a thermal oxide.

5. The method of claim 2, wherein the pre-existing oxide is a deposited oxide.

6. The method of claim 1, wherein the generating of the fluorine radicals comprises providing a fluorine precursor to the plasma generation source at a flow rate between about 5 and about 100 sccm.

7. The method of claim 6, wherein the fluorine precursor comprises at least one of $NF_3$, $BF_3$, $SiF_4$, or $CF_4$.

8. The method of claim 1, wherein the generating of the oxygen radicals comprises providing an oxygen precursor to the plasma generation source at a flow rate between about 15 and about 500 sccm.

9. The method of claim 8, wherein the oxygen precursor comprises at least one of $O_2$, $O_3$, or $H_2O$.

10. The method of claim 1, wherein the fluorine radicals are generated from $NF_3$ and the oxygen radicals are generated from $O_2$; and
    wherein a ratio of the $NF_3$ to the $O_2$ in the plasma generation source is between about 0.1 and about 10.

11. The method of claim 1, wherein the plasma generation source operates at a power between 100 and 1000 W.

12. The method of claim 1, further comprising passing the oxygen radicals and the fluorine radicals through an ion filter.

13. The method of claim 1, wherein the substrate is maintained at a temperature between about 25 C and about 400 C.

14. The method of claim 1, wherein the substrate is exposed to the combination of the fluorine radicals and the oxygen radicals for a duration between about 30 seconds and about 15 minutes.

15. The method of claim 1, wherein the pre-existing oxide and the new oxide are etched at a rate between about 3 and about 7 Å/min by the combination of the fluorine radicals and the oxygen radicals.

16. The method of claim 1, wherein a surface roughness of the substrate is less than about 0.7 nm rms after the substrate is exposed to the combination of the fluorine radicals and the oxygen radicals.

17. The method of claim 1, further comprising:
    purging at least the oxygen radicals from the process chamber; and
    removing a remaining oxide passivation layer from the underlying semiconductor.

18. The method of claim 1, further comprising exposing the substrate to oxygen radicals without any etching species before the substrate is exposed to the combination of the fluorine radicals and the oxygen radicals.

19. The method of claim 1, further comprising forming an oxygen-impermeable layer in-situ over the underlying semiconductor after the substrate is exposed to the combination of the fluorine radicals and the oxygen radicals.

20. The method of claim 19, wherein the oxygen-impermeable layer comprises a metal or a metal nitride.

* * * * *